(12) United States Patent
Waslowski

(10) Patent No.: US 10,641,894 B2
(45) Date of Patent: May 5, 2020

(54) SENSOR FOR DETECTING AN OBJECT AND METHOD OF SETTING A SWITCHING POINT

(71) Applicant: SICK AG, Waldkirch (DE)

(72) Inventor: Kai Waslowski, Waldkirch (DE)

(73) Assignee: SICK AG, Waldkirch (DE)

( * ) Notice: Subject to any disclaimer, the term of this patent is extended or adjusted under 35 U.S.C. 154(b) by 14 days.

(21) Appl. No.: 16/042,023

(22) Filed: Jul. 23, 2018

(65) Prior Publication Data

US 2019/0049581 A1 Feb. 14, 2019

(30) Foreign Application Priority Data

Aug. 9, 2017 (DE) .......................... 10 2017 118 083

(51) Int. Cl.
| | |
|---|---|
| *G01S 17/04* | (2020.01) |
| *G01V 8/10* | (2006.01) |
| *G01S 7/481* | (2006.01) |
| *G01S 17/42* | (2006.01) |
| *G01S 17/46* | (2006.01) |
| *G01V 8/20* | (2006.01) |
| *H03K 17/968* | (2006.01) |

(52) U.S. Cl.
CPC .............. *G01S 17/04* (2020.01); *G01S 7/481* (2013.01); *G01S 17/42* (2013.01); *G01S 17/46* (2013.01); *G01V 8/10* (2013.01); *G01V 8/20* (2013.01); *H03K 17/968* (2013.01); *H03K 2217/941* (2013.01); *H03K 2217/965* (2013.01)

(58) Field of Classification Search
CPC ........ G01S 17/026; G01S 7/481; G01S 17/42; G01S 17/46; G01S 17/04; G01V 8/20; H03K 17/968
USPC ......................................................... 356/614
See application file for complete search history.

(56) References Cited

U.S. PATENT DOCUMENTS

| | | | |
|---|---|---|---|
| 6,400,460 B1 * | 6/2002 | Chen ....................... | G01S 7/486 356/614 |
| 6,498,333 B1 * | 12/2002 | Christensen ............ | G01S 7/497 250/214 AG |

(Continued)

FOREIGN PATENT DOCUMENTS

| | | |
|---|---|---|
| DE | 19718391 A1 | 11/1998 |
| DE | 19730341 A1 | 1/1999 |

(Continued)

*Primary Examiner* — Roy M Punnoose
(74) *Attorney, Agent, or Firm* — Nath, Goldberg & Meyer; Jerald L. Meyer

(57) ABSTRACT

A sensor (10) is provided for detecting an object (20) in a monitored zone (18), having at least one sensor element (36) for detecting a sensor signal; having a switch output (30) for outputting a binary object determination signal; and having an evaluation unit (28) that is configured to generate the object determination signal from the sensor signal in dependence on the detected object (20) and to determine, in a teaching phase, a switching point that determines the association between the sensor signal and the object determination signal. The evaluation unit (28) is further configured to detect a respective sensor signal for a plurality of detection situations in the teaching phase, with the associated object determination signal being predefined for the respective detection situation and with the switching point being derived therefrom.

18 Claims, 3 Drawing Sheets

(56) References Cited

U.S. PATENT DOCUMENTS

| | | | |
|---|---|---|---|
| 7,030,972 B2* | 4/2006 | Donahue | B41J 2/17546 235/454 |
| 7,732,797 B2* | 6/2010 | Stimpson | B23Q 17/2442 250/559.14 |
| 8,537,359 B2* | 9/2013 | Stimpson | B23Q 17/24 356/426 |
| 8,575,582 B2* | 11/2013 | Klein | G01S 7/497 250/222.1 |
| 2012/0126152 A1* | 5/2012 | Klein | G01S 7/497 250/578.1 |
| 2014/0035775 A1 | 2/2014 | Zeng et al. | |
| 2016/0180192 A1* | 6/2016 | Ayvaci | G06K 9/00805 382/104 |
| 2018/0275310 A1* | 9/2018 | Horsch | G01V 8/14 |

FOREIGN PATENT DOCUMENTS

| | | |
|---|---|---|
| DE | 10329881 A1 | 1/2005 |
| DE | 10353981 A1 | 6/2005 |
| DE | 202007004364 U1 | 6/2007 |
| DE | 19721105 C5 | 7/2008 |
| DE | 102008050943 A1 | 4/2010 |
| DE | 102010032042 A1 | 1/2011 |
| DE | 102011050119 A1 | 11/2012 |
| WO | 2016095882 A1 | 6/2016 |
| WO | 2016110844 A1 | 7/2016 |

\* cited by examiner

SENSOR FOR DETECTING AN OBJECT AND METHOD OF SETTING A SWITCHING POINT

BACKGROUND

1. Field

The invention relates to a sensor for detecting an object an object in a monitored zone and to a method of setting a switching point of a sensor that detects objects in a monitored zone.

2. Description of the Related Art

The detection of an object is a fundamental function of the most varied sensors, from inductive, magnetic, or capacitive sensors, over ultrasound sensors, up to optoelectronic sensors. There are in turn subfamilies of every physical principle. Optoelectronic sensors include through beam light barriers and reflection light barriers that recognize interruptions or attenuations of a light beam directed onto a light receiver directly or via a reflector. Cameras in a number of variations, including linear cameras and 3D cameras, are also optoelectronic sensors.

A further group is formed by light scanners whose light beam is guided in a scanning manner into the monitored zone and is only registered in a light receiver when an object is located in the monitored zone at which the light beam is reflected. An energetic sensor evaluates the intensity of the receiver signal using a switching threshold. A contrast sensor recognizes differences in brightness or color. With a triangulation sensor, the optical axes of the light transmitter and the light receiver are slanted with respect to one another and the angle at which an object is detected can be measured with the aid of a spatially resolving light receiver and a distance can thus be determined. In so-called background masking light sensors such as disclosed in DE 197 21 105 C2, the design of a triangulation sensor is used to generate two received signals using a light receiver that spatially resolves at least in one near zone and one far zone. Their difference is evaluated with a switching threshold in order thus to restrict the object detection to a specific distance zone and to mask reception signals from objects outside this distance zone as a background signal.

The switching sensors considered here can admittedly record information in the most varied manners, but the goal is a binary object determination signal whose state indicates whether an object that must optionally comprise certain properties has been detected or not. The so-called switching point must be set so that the desired objects are detected. This switching point defines one or more thresholds, hystereses, or processing rules with which the detected sensor signals or measurement signals are converted into the binary object determination signal. Simple examples are a level threshold from which onward the light beam of a light barrier is deemed to be interrupted or a distance from which onward an object is ignored by a background masking sensor.

In the prior art, the switching point is defined via a potentiometer, an encoder, or a digital numerical value, with the latter having to be determined beforehand and transmitted, for example, via a parameterizing interface on the basis of IO-Link. Conventional sensors provide a teaching process for this that is triggered by a pressing of a button. The switching point is typically set such that the object is just recognized and accordingly just corresponds, for example, to the current object distance with a triangulation sensor.

This switching point adjustment with exactly one reference object does not take account of the possible variation of the foreground objects and background objects to be detected. To remain with the example of the triangulation light sensor, specific differences always result between the real object distance and the measured object distance in dependence on the surface properties of the objects to be detected such as shininess, printing, inhomogeneities, and the like. In addition, the positions and dimensions of the objects are themselves subject to tolerances. If all the theoretically conceivable extremes such as black velvet and white, ideally remitting bodies or optical mirrors at any desired angles, and thus all the theoretically possible detection errors and detection differences were taken into account in the setting of the switching point, the minimal distance between the real object and the real background would have to be so large that it cannot even be realized in typical applications of the sensor.

The pragmatic practical solutions is to pursue trial and error in critical applications for so long until the set switching point permits a satisfactory separation between the object and the background. This manual procedure even typically works satisfactorily because the users have developed a feeling for how many reserves have to be added to a switching point for a sufficient robustness. However, this naturally requires correspondingly experienced users. In addition, the method reaches its limits at the latest when even the intuition of an expert fails to imagine still suitable criteria for the determination of the object determination signal in complex situations with the most varied objects or with a plurality of internally available sensor signals.

EP 2 975 769 A1 discloses an optoelectronic sensor having a depressable operating element to define a reference value to a taught value predefined by the current receiver signal. This is therefore an example for the described conventional teaching process.

In DE 197 18 391 A1 a histogram is formed by occurring signals of an optoelectronic sensor to locate a suitable threshold and later to track it in accordance with the respective given operation conditions. DE 10 2011 050 119 A1 not only evaluates the signal level to adapt the threshold, but also its variation or even higher statistical moments. DE 10 2015 107 221 A1 deals with a threshold adaptation with inductive sensors. In these approaches, the sensor sets its switching point itself and thus respectively decides itself how a detection situation is to be evaluated. This is often helpful, but does not in all cases have to coincide with the actual goals of the application.

SUMMARY

It is therefore the object of the invention to further develop a sensor such that it works more reliably and can better detect the situation to be detected.

This object is satisfied by a sensor for detecting an object and by a method of setting a switching point in accordance with the respective independent claim. The sensor has at least one sensor element to detect a sensor signal. A binary object determination signal is acquired from this and is output to a switch output. The association between the sensor signal and the object determination signal is fixed by a switching point that is determined in a teaching phase. The term switching point is based on simple one-dimensional sensors. The term is, however, to be given a wide interpretation in accordance with the invention. The sensor signal can originate from a plurality of sources and can be multi-dimensional or even high dimensional. The switching point also then designates the criteria, the function, or the classifier by which the sensor signal is evaluated to make a binary decision for the state of the object determination signal. In this simplest case, it is purely a determination of presence. It can, however, also be bound to additional conditions such as determined distance zones in which the object is located or to object properties such as a minimum or maximum size, a color or any other property that can be distinguished using the sensor signal. Like the sensor signal itself, such additional conditions can also become complex and can, for example, depend on the past as in the case of a hysteresis.

The invention starts from the basic idea of designing the teaching phase as a training phase for a monitored training of the switching point. For this purpose, the sensor is confronted with a plurality of detection situations of the later operation and in so doing detects its sensor signal. The respective associated object determination signal is predefined (supervised learning, tagging, labeling). This is preferably done in a direct temporal relationship, that is during or briefly after the respective detection situation; it can, however, in principle also be subsequently merged or even determined for the first time. The switching point is now determined using the labeled training data, namely the sensor signals with the associated desired object determination signal. The switching point is, for example, placed such that the predefined associated object determination signal is reproduced for all the sensor signals measured in the teaching phase, and indeed for robustness with an interval of the switching point for all the sensor signals measured in the teaching phase that is as large as possible. It is, however, not compulsory that the switching point actually evaluates all the object determination signals in operation as in training; it is an optimization with assessment. It is possibly better if the switching point falsely classified a few overshoots of the training than if the robustness has to be fully surrendered.

The linking of the sensor signals with the respective predefined object determination signal, i.e. the labeling or tagging of the training data, and the deriving of a suitable switching point, only preferably takes place in the sensor itself; it can be carried out externally or be assisted from external. The object determination signal is also at least indirectly predefined for the evaluation unit of the sensor in the latter case and a switching point is derived in the sense of taking over the external result.

The invention has the advantage that the manual adjustment is replaced via potentiometers, encoders or a teach button with an automated setting of the switching point. The switching point takes account of the variation of the detection situations and is thereby a lot more flexible and robust. It is no longer necessary that the teaching is cried out by experts having experience for the sensor and for the application. The set switching point can be transmitted to other sensors, for example to a replacement device. The teaching in accordance with the invention of a switching point also works in complex situations with multi-dimensional sensor signals and unclear conditions at an object to be determined. The sensor itself can, however, remain very simple since in operation only the comparisons or classifications predefined by the switching point have to be carried out for its sensor signal. This above all applies when the processing effort of the teaching phase is outsourced to external and the sensor does not have to provided it itself.

The sensor preferably has a training input for the predefined object determination signal. The associated object determination signal is predefined for the sensor from this during a detection situation or at least in a relationship that can be associated from outside with a detection situation. It is preferably a physical input or pin that can adopt two states in accordance with the binary object determination signal. This input can, however, be connected to a line that has a completely different function in operation that was possibly also already present in conventional sensors. It is also conceivable to implement the training input as a command in an interface protocol such as an IO-Link. The training input is not a teach button, since no object determination signal is predefined via it, but only the teaching process is triggered. A sensor in accordance with the invention could, however, additionally have a teach button, with the teaching process equally being able to be started via a specific signal sequence at the training input.

At least one additional sensor preferably generates the predefined object determination signal. The additional sensor evaluates the detection situations of the teaching phase and predefines this evaluation for the sensor in accordance with the invention. The additional sensor is in particular only provided temporarily during the teaching phase. The additional sensor can then be removed again. The additional sensor therefore does not take up any space or any maintenance in operation and also does not have to be acquired, but can rather be used consecutively for a plurality of teaching phases at different locations or even in its own application. Alternatively, the additional sensor also remains installed after the teaching phase, but is then switched off; or its signal is no longer considered outside the teaching phase by the sensor in accordance with the invention.

At least one object changing the detection of a sensor signal is preferably arranged in the monitored zone during the teaching phase. The object serves as an aid for the teaching phase. The object is preferably only temporarily located in the monitored zone at least at times or over the total teaching phase; that is it is removed again after the teaching phase. The object can influence the sensor signal of the sensor itself and can, for example, improve the object detection. This is not always advantageous since then the detection situation differs from the actual operation. The object therefore preferably influences the sensor signal of the additional sensor, and indeed in a manner that the sensor in accordance with the invention does not perceive. Examples for additional optical sensors are adhesive bands with black and white contrasts, colors, reflectors, or polarizing properties on the objects to be detected or on the background; correspondingly conductive or magnetic objects would be conceivable for inductive, capacitive, or magnetic sensors.

A switch output of the additional sensor is preferably connected to the training input. The additional sensor thus directly becomes the teacher of the sensor in accordance with the invention. The user then no longer has to change anything at the sensors during the teaching phase and only has to take care that the detection situations are implemented, that is, for example, start the system. The teaching then takes place automatically (auto-teach).

The additional sensor preferably detects a different sensor signal than the sensor and/or evaluates the sensor signal in a different manner. A different sensor principle or at least a variation of a parameter of the sensor detection are thus meant. Two sensors could anyway not detect the same sensor signal. The sensor in accordance with the invention and the additional sensor are therefore diverse in at least one property such as a light barrier to a light sensor or any number of other combination possibilities. This is particularly advantageously combined with an already explained auxiliary object in the monitored zone that assists the detection of the additional sensor. Exemplary additional sensors are a contrast sensor having colored adhesive strips, a code reader with codes, and a lot more.

The additional sensor is preferably based on a more complex and/or more error prone sensor principle than the sensor. Such an additional sensor could possibly also satisfy the application, but would be too expensive or too short-lived. It is also conceivable that the additional sensor can admittedly reliably derive the desired object determination signal, but in another respect could not replace the sensor in accordance with the invention, for example due to its construction size or response time. Examples are cameras with complex image evaluation algorithms or fast-wearing tactile sensors.

The additional sensor is preferably arranged in a position and/or in a manner that does not correspond to any of the positions and/or manners possible for the sensor during operation. The installation of the additional sensor is therefore only temporarily possible during the teaching phase. For example, connector lines of the additional sensor are led in a manner that is not robust enough for everyday operation or that uses provisional support constructions for the sensor or its connectors. It would also be possible to conceive that the desired detection position of the additional sensor is not available in operation, for instance because the additional sensor detects from the side, but this would disrupt the routines in operation and therefore only an installation from above is possible for the sensor in accordance with the invention.

At least one one-dimensional or multi-dimensional histogram is preferably formed from the sensor signals detected in the teaching phase and the switching point is derived from the histogram. It is further preferably a question of two histograms, namely one each for both possibilities of the predefined binary object determination signal. The histogram prepares the sensor signal in a manner that enables the derivation of a switching point with a simple consideration of the various detection situations. In a one-dimensional example, the occurrences of the measured levels of the sensor signal are collected in a histogram during the different detection situations. As already mentioned, the sensor signal can also be multi-dimensional and it is then sensible to form a multi-dimensional histogram. The plurality of dimensions can relate to the same sensor element, for instance the level and phase or the mean value and the variation. Alternatively or additionally, a plurality of measurement results are detected, for instance two reception elements or even a number of pixels of an image sensor or a light signal and a signal of an inductive sensor element.

The switching point preferably has at least one threshold or a boundary curve. A threshold is a very simple and proven criterion, in particular for a one-dimensional sensor signal. It can, for example, be placed between maxima of a histogram. A plurality of thresholds and/or hystereses are conceivable. In the n-dimensional case, a threshold corresponds to an n−1 dimensional boundary curve, in particular a plane or a hyperplane, that separates clusters in an n-dimensional histogram of sensor signals evaluated with the same object determination signal.

The switching point preferably has a classifier. Particularly with high dimensional sensor signals such as from the pixels of an image sensor, it is sometimes no longer practical to define a geometrical structure as the switching point, said geometrical structure unambiguously and robustly sufficiently separating the states of the object determination signal. It is then sensible to use a classifier that associates an object determination signal with the sensor signals. The classifier can be a classical or a deterministic classifier that is parameterized in the teaching phase. It is particularly preferably a classifier in accordance with a method of machine teaching. All the methods are generally possible here that can be trained by the labeled training data of the teaching phase, in particular simple or also larger neuronal networks (CNN, deep learning).

The sensor is preferably connected to a higher ranking processing unit, in particular to a serve or to a could, during and/or after the teaching phase and the switching point is determined in the processing unit and is returned to the evaluation unit. In such an embodiment, the training data from the teaching phase, i.e. the sensor signals labeled by the associated predefined object determination signal, are transmitted to the processing unit. The switching point is derived there, which is very time and processing intensive under certain circumstances. The switching point is reflected back to the sensor, for instance in the form of at least one threshold, a boundary curve, or the weighting factors, or more generally a description file of a fully trained neuronal network. The sensor can thereby remain simple; the large processing capacities only required in the teaching phase are provided from external (remotely). It is also conceivable only to transmit the sensor signals themselves instead of the already labeled sensor signals to the processing unit. The evaluation, that is the labeling, then only takes place in the processing unit. For example, powerful evaluations are available in the processing unit for this purpose that evaluate the sensor signals and that go far beyond the possibilities of the sensor. The additional sensor could additionally be connected to the processing unit instead of to the sensor in order thus to carry our or assist the evaluation. The correct association can be ensured by a simultaneous transmission of sensor signals of the sensor in accordance with the invention and of the additional sensor, but also by asynchronous transmission of sensor signals that are provided with time stamps or the like for this purpose.

The sensor is preferably a light barrier or a light sensor. It is a frequently used sensor that is simple and proven and that particularly profits from the considerably improved setting of the switching point. The light barrier can be a through beam light barrier or a reflection light barrier; the light sensor can have a background masking or a distance measurement by a time of flight method or by triangulation. Alternatively, the sensor can be an inductive, capacitive, magnetic, ultrasound, or radar sensor.

The sensor preferably has a plurality of sensor elements having different properties. The wavelength of a transmission element of an optoelectronic sensor can be switched over, for example, or a plurality of transmission elements and optionally reception elements are provided. The sensor can be able to detect additional values such as the pressure, temperature, or sound without this being initially specifically adapted to an application. Such a multisensor is either intended from the start to detect various measurement values or a main principle such as an optical detection is already furthermore provided; however, there is simultaneously the possibility of measuring physical conditions by auxiliary sensors. The various sensor signals of the multisensor are then collected in the teaching phase and are evaluated in one of the explained manners, that is an object determination signal is associated with them. This training data set is preferably used externally to derive a switching point. The sensor is usable in this manner for different applications using a separate evaluation that is simple per se—one or more thresholds are sufficient in many cases and a trained neuronal network also takes up relatively few resources—by an intelligence that is only temporarily provided, for example via a cloud, and that is more powerful by orders of magnitude.

The method in accordance with the invention can be further developed in a similar manner and shows similar advantages in so doing. Such advantageous features are described in an exemplary, but not exclusive manner in the subordinate claims dependent on the independent claims.

The invention will be explained in more detail in the following also with respect to further features and advantages by way of example with reference to embodiments and to the enclosed drawing. The Figures of the drawing show in:

DETAILED DESCRIPTION OF THE PREFERRED EMBODIMENTS

Figure 1:
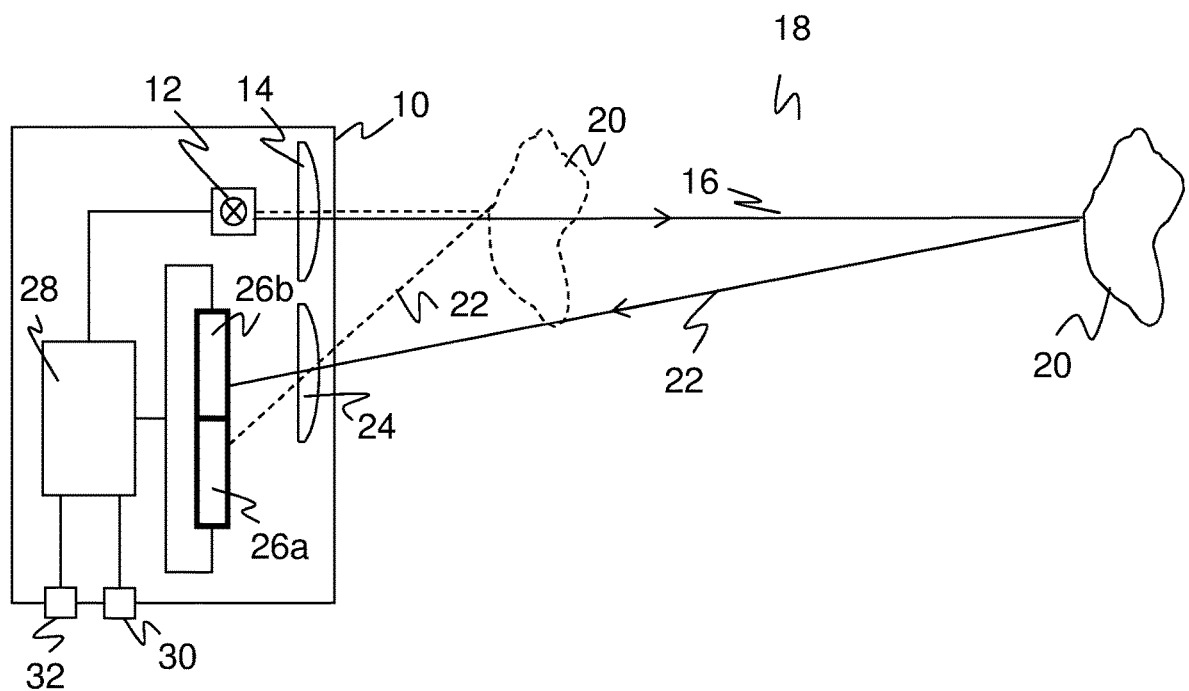
FIG. 1 a schematic sectional view of a sensor.

FIG. 1 shows a schematic sectional representation of a sensor 10 in an embodiment as a conventional triangulation light sensor with background masking. This is only one of a large number of embodiments of a sensor 10 in accordance with the invention with reference to which it should be explained purely by example how a sensor 10 detects an object determination signal by means of a settable switching point. The invention generally comprises sensors that delivery a binary object determination signal such as reflection light barriers, through beam light barriers, or distance-measuring light sensors in accordance with the principle of the time of flight process or of triangulation, but also inductive, capacitive, magnetic, ultrasound, or radar sensors and more.

In the embodiment of the sensor 10 in accordance with FIG. 1, a light transmitter 12 transmits a light beam 16 into a monitored zone 18 via a beam-shaping transmission optics 14. If the light beam 16 is incident on an object 20, a portion of the transmitted light returns to the sensor 10 as a remitted or reflected transmitted light beam 22. A reception optics 24 intercepts this remitted transmitted light beam 22 and conducts it to a light receiver 26 where the incident light is converted into an electrical reception signal. An evaluation unit 28 is connected to the light receiver 26 to determine an object determination signal that is output at a switch output 30 from the electrical reception signals depending on the presence of an object 20.

The sensor 10 has background masking. The light receiver 26 is divided into a near zone element 26a and a far zone element 26b. Due to the offset between the light transmitter 12 having the transmission optics 14 with respect to the light receiver 26 having the reception optics 24 and due to the arrangement of the two reception elements 26a-b along the transverse connection between the light transmitter 12 and the light receiver 26, the remitted light beam 22 of a near object 20 shown by dashed lines is incident onto the near zone element 26a and the remitted light beam 22 of a far object 20 shown by solid lines in incident onto the far zone element 26b. The evaluation unit 28 forms the difference between the signals of the near zone element 26a and of the far zone element 26b and evaluates this difference with a threshold for the background masking.

The switching point of the sensor 10 determines which distances of the sensor 10 are to be considered background and are to be masked. This can be set mechanically via an adjustable lens position; alternatively by a variable combination of pixels of a linear sensor with respect to the near and far zone elements 26a-b and, to a certain extent, also via the threshold. It is also conceivable not to directly sum the pixel signals of a linear sensor, but to initially treat them individually.

The switching point has to be set accordingly for the application of the sensor 10 so that only the correct objects are detected and there is no confusion, for example, with background objects or objects are incorrectly masked and thus overlooked. For this purpose in accordance with the invention, a large number of detection situations with and without an object to be detected are presented to the sensor 10 in a teaching phase. These detection situations are evaluated from the outside for which there are the most varied possibilities that are still to be described. It is therefore fixed from the outside whether the object should be detected in the respective detection situation or not or whether the desired object determination signal should be predefined.

The sensor 10 in accordance with FIG. 1 has a training input 32 for the object determination signal predefined from the outside. This can be a dedicated additional input. In some conventional sensors, a suitable control line is anyway present at the electric interface that was used to date for the test-wise switching off of the light transmitter 12, for a light/dark switchover, or for triggering a teaching process. This control line can be used in a preferred embodiment during the teaching phase in accordance with the invention for the training input 32.

All the desired objects are now presented to the sensor 10 in the later relevant variations through the optical path during the teaching or training phase for setting the switching point. They can be artificially prepared detection situations; however, it is the easiest to observe the later application and, for example, to set the system into operation in which the sensor 10 is installed for this purpose. In parallel with this, the associated desired object determination signal is fed in via the training input 32. The sensor 10 can then independently set its switching point in a suitable manner.

The teaching phase thus comprises three modules: Detecting sensor signals of the respective detection situations; evaluating the detection situation by predefining a desired object determination signal; and finally deriving a switching point. Only the first step necessarily takes place by the sensor 10 itself. A desired object determination signal can also be externally associated with detected sensor signals here. The final derivation of a switching point equally takes place in the separate evaluation unit 28 of the sensor 10 or externally depending on the embodiment. After the termination of the teaching phase, the evaluation unit 28 has either found the switching point itself or the required data for the switching point such as thresholds or parameters and weightings of a classifier or of a neuronal network are reflected back to the evaluation unit 28 for the subsequent actual operation.

The detection of sensor signals has already been explained for the example of the sensor 10 in accordance with FIG. 1. The second step will first be explained in the following with reference to FIGS. 2 and 3; namely how a desired object determination signal can be generated in a suitable manner, which can inter alia depend on the sensor 10, on the properties of the objects to be detected, and on conditions of the application. The final step of deriving a suitable switching point from the sensor signals and from the associated desired object determination signals will then be looked at with reference to FIGS. 4 and 5.

Figure 2:
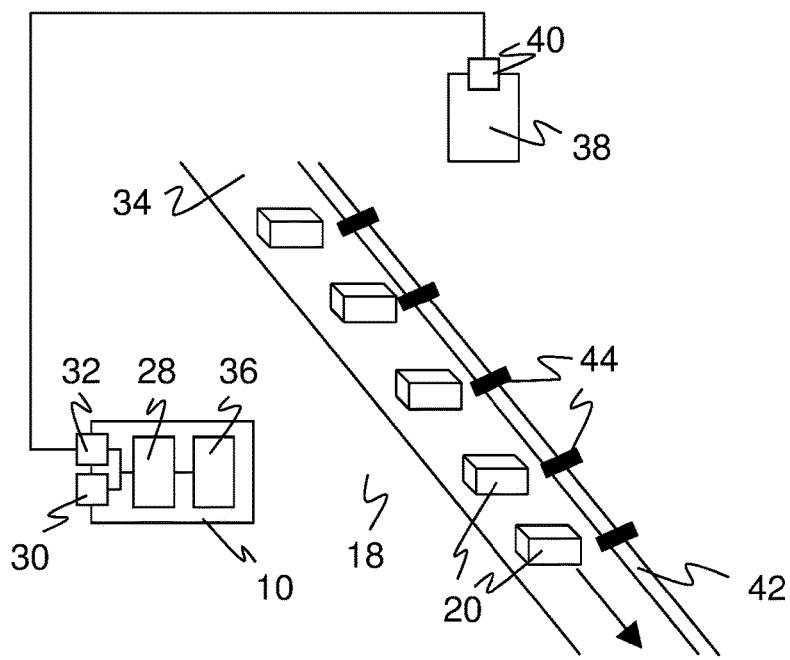
FIG. 2 a representation of an application of a sensor at a conveyor belt with an additional sensor that predefines an object determination signal.

FIG. 2 illustrates an exemplary application of the sensor 10 for detecting flat objects 20 on a conveyor belt 34 in this case. The actual sensor system of the sensor 10 is here shown in summary as a sensor element 36. This also again emphasizes that the invention is not restricted to any specific sensor design, not even to a sensor type or to a physical sensor principle. The sensor signal is accordingly generalized by the received signal of a light receiver 26 and can be multi-dimensional if the sensor 10 delivers a plurality of measurement values.

An additional sensor 38 is connected by a switch output 40 to the training input 32 of the sensor 10. The additional sensor 38 in this manner predefines the desired object determination signal during the teaching phase. Alternatively to a connection line between the switch output 40 and the training input 32, other communication paths are also conceivable, for example commands within a protocol such as IO-Link or even a wireless connection.

The additional sensor 38 is a contrast sensor in this example. To make the task easier for this contrast sensor, a continuous bright track is marked by adhesive tape 42 on the conveyor belt 34. The objects 20 are equidistant or are preferably arranged in another manner corresponding to typical operation on the conveyor belt 34. The positions of the objects 20 are marked by an additional dark adhesive tape 44. The additional sensor 38 formed as a contrast sensor therefore very reliably recognizes when a respective object 20 is located in the monitored zone 18 of the sensor 10 and predefines the corresponding object determination signal for the sensor via the switch output 40 and the training input 32.

A contrast sensor installed from above is only one of many examples of an additional sensor 38. It is thus initially not absolutely necessary to support the additional sensor 38 by aids such as the adhesive tape 42, 44. Other additional sensors 38 and/or aids can naturally also furthermore be used, for instance in that object positions are marked by codes and are detected by a code reader as the additional sensor 38. It is, however, advantageous if the additional sensor 38 clearly differs from the sensor 10 in its manner of function an/or in its working position and is thereby put into a position to generate reliable evaluations and thus desired object determination signals.

A further specific example without its own representation is channel conveying where objects are conveyed in a plurality of parallel channels and should be recognized independently from above by the sensor 10 or by a plurality of such sensors 10. It would be technically a lot simpler and more robust here to detect the objects laterally using a through beam light barrier. This installation is, however, impractical or even impossible in channel conveying, in particular for individual channels. Provisionally, however, a through beam light barrier can be adhesively bonded into the channel as an additional sensor 38 and its connector line can be laid freely through the air. If there is a separating wall between the channels to which the through beam light barrier can be attached, there is the possibility of using moveable little arms as holders. Alternatively, the through beam light barrier is installed over all the channels and provision is artificially made that objects are only located on a respective single one channel to be trained during the teaching phase. The sensor 10 for the respective channels is now trained with the aid of the through beam light barrier, in particular in that the switch output of the through beam light barrier is connected to the training input 32. The sensor 10 is then able also to trigger satisfy the application in an installation from above, for which purpose a through beam light barrier would be fully unsuitable in another respect. The through beam light barrier used as the additional sensor 38 can be removed again on the conclusion of the teaching phase in order not to disrupt the further operation. it can even only be borrowed for the setting up and can subsequently be taken along by the employee of the manufacturer or can be sent back to the manufacturer.

Figure 3:
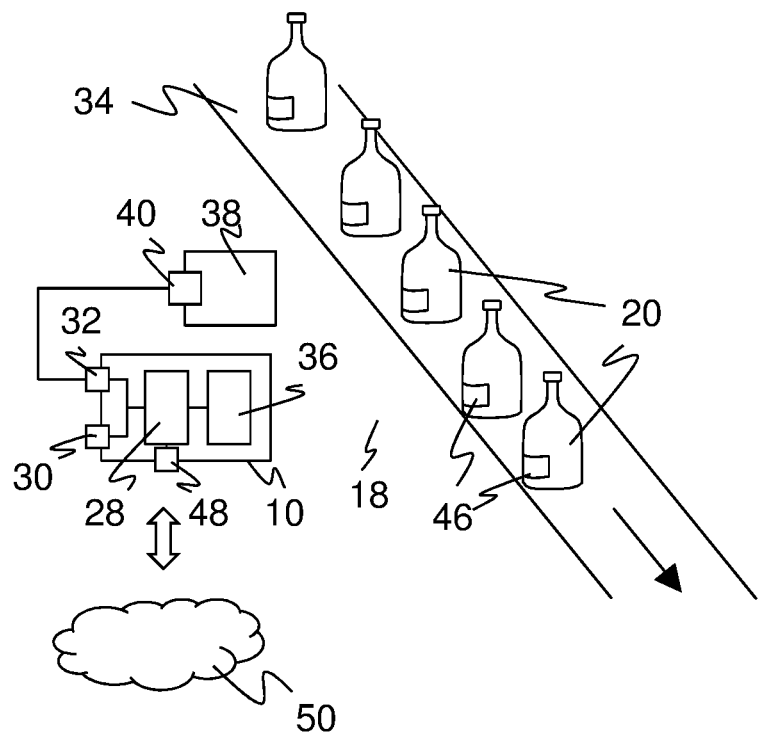
FIG. 3 a representation similar to FIG. 2, but with different objects to be detected and with another additional sensor in a different position.

FIG. 3 illustrates a further exemplary application of the sensor 10 for detecting transparent bottles as objects 20 on a conveyor belt 34. The problem with the detection of transparent objects is that a good portion of the transmitted light passes through the object and is so lost or returns later from the background and thus from a different distance. In addition, particularly bottles also have shiny properties and lens properties in addition to transparency properties. In accordance with the invention, the bottles can be provided with a label or a wrapper 46 of reflector film during the teaching phase. The sensor 10 could thus already detect more reliably itself. In this sense, the wrapper 46 then predefines the object determination signal.

It is, however, even preferred in accordance with the invention if the wrapper 46 is actually not located in the monitored zone 18 of the sensor 10 so that the sensor 10 does not detect any sensor signals falsified with respect to the later operation without a wrapper 46 in the teaching phase. The wrapper 46 can for this purpose, differing from FIG. 3, be attached to the respective rear surface of the bottle. The desired object determination signal is generated by a simple reflection sensor that in this example acts as an additional sensor 38, reliably detects the wrapper 46, and transmits it via its switch output 40 to the training input 32.

The sensor 10 shown in FIG. 3 additionally has a wired or wireless communication interface 48 via which a connection to a cloud 50 can be established. The cloud 50 is representative of a further processing unit having superior processing capacities with respect to the sensor 10. The sensor 10 in this embodiment only generates labeled training data, namely the sensor signals in the respective detection situations and the associated object determination signals predefined by the additional sensor 38. The switching point is then not determined by the evaluation unit 28 itself, but is externally determined in the cloud 50 and is subsequently returned to the evaluation unit 28 for use in operation.

The question of which steps of the teaching phase are carried out in the evaluation unit 28 itself or externally in the cloud 50, for example, is independent of how the respective sensor signal and the desired object determination signal are generated. A corresponding outsourcing into a cloud 50 would therefore also in particular be possible, for instance for the embodiments explained with reference to FIG. 2; or in the example of FIG. 3, this still takes place in the evaluation unit 28 without the sensor 10 utilizing a communication interface 48 and a cloud 50.

It would also be conceivable to omit the additional sensor 38 in FIG. 3. The wrappers 46 can alternatively be designed as codes. The sensor 10 detects the changing intensity of the code in its sensor signal, but cannot interpret it itself. The sensor signal is rather transmitted to the cloud 50 after a possible buffering. The code is read there, the sensor signal having the code contents and the gaps in which no codes can be read can be linked to a labeled test data set, a switching point can be derived therefrom, and it can be transmitted to the sensor 10.

It is the common idea underlying the exemplary possibilities described with reference to FIGS. 2 and 3 of predefining an object determination signal to use further information or at least evaluation capacities in addition to the separate sensor signal of the sensor 10 in the teaching phase, but to do so only temporarily. A very reliable object determination signal is in particular generated by a mechanical or electronic additional effort or by a very expensive or fast-wearing sensor system. As soon as training data have thus been acquired for teaching the sensor 10, the additional effort can be removed again. The configuration of the taught sensor 10 prepared in this manner can also be duplicated on further sensors. The teaching therefore only has to take place once prototypically and be reproduced for all comparable or identical applications.

If now, as described above in some examples that are by no means exclusive, a training data set of sensor signals having desired associated object determination signals is present, the sensor 10 is trained therewith as a final step of the teaching phase, that is a switching point is derived. Switching point furthermore means that that association rule or that classifier with which a binary object determination signal is assigned to a sensor signal, also a high dimensional sensor signal, possibly also under highly complex conditions. Depending on the embodiment, this takes place in the evaluation unit 28 and/or externally, for instance in the cloud 50.

The procedure depends on the number of available parallel pieces of measurement information, i.e. on the dimension of the sensor signal and on the conditions to be considered. In many cases, a continuous or discrete function $f$ for the object determination signal Q is sought in dependence on the sensor signal S, with the structure of the function $f$ also being able to be predefined and still having to be parameterized. $Q=f(S)$.

Figure 4:
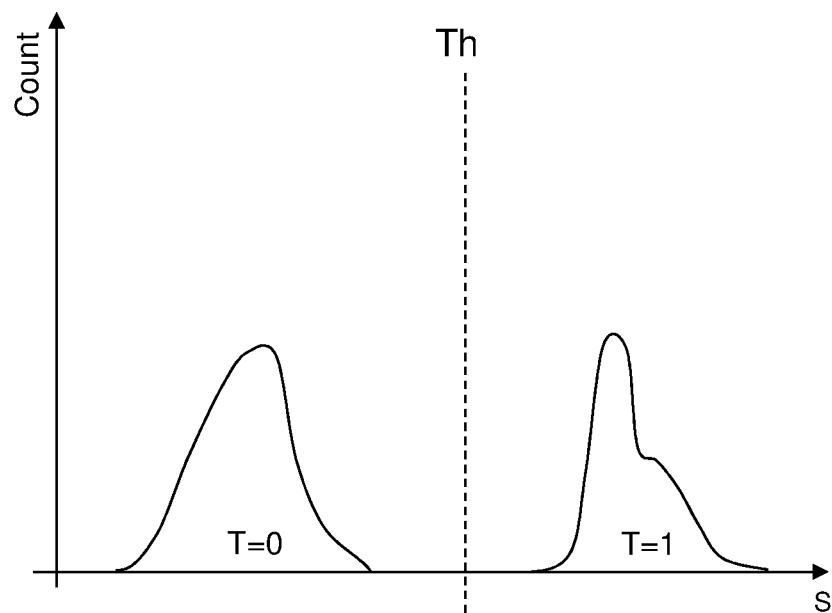
FIG. 4 a schematic representation of a one-dimensional histogram of evaluated sensor signals and a possible switching point derived therefrom.

FIG. 4 illustrates the deriving of the switching point for a simple one-dimensional case. In this embodiment, a threshold Th is sought to parameterize the switching point $Q=sgn(S-Th)$. A histogram of the sensor signal is formed for this purpose to determine how the sensor signal is distributed in the detection situations, in particular where a specific state of the predefined object determination signal occurs in clusters or not at all. It is particularly advantageous if two such histograms are formed, namely one each for both binary states of the predefined object determination signal T.

The example in FIG. 4 show such a double histogram. Two clear clusters or peaks for the states T=0 and T=1 are shown with an intermediate zone in which the desired switching threshold Th can be placed. This descriptive procedure is mathematically an optimizing task in which the switching threshold Th is set such that the spacing between the threshold and each data point is as large as possible.

The representation of FIG. 4 with a clear separation between the states T=0 and T=1 is not idealized, but realistic. However, in difficult applications, the separation or the spacing between the two peaks could turn out to be considerably less. Furthermore, individual overshoots in the region of the respective other state T are also not completely impossible that could then be illustrated by double bins having different colors or hatching. With a switching threshold, there is little else to do than to ignore such overshoots.

A different procedure would also be conceivable for more complex switching points to weigh up errors of a first and second kind (switching to an object not actually present or an overlooked object) against one another.

Figure 5:
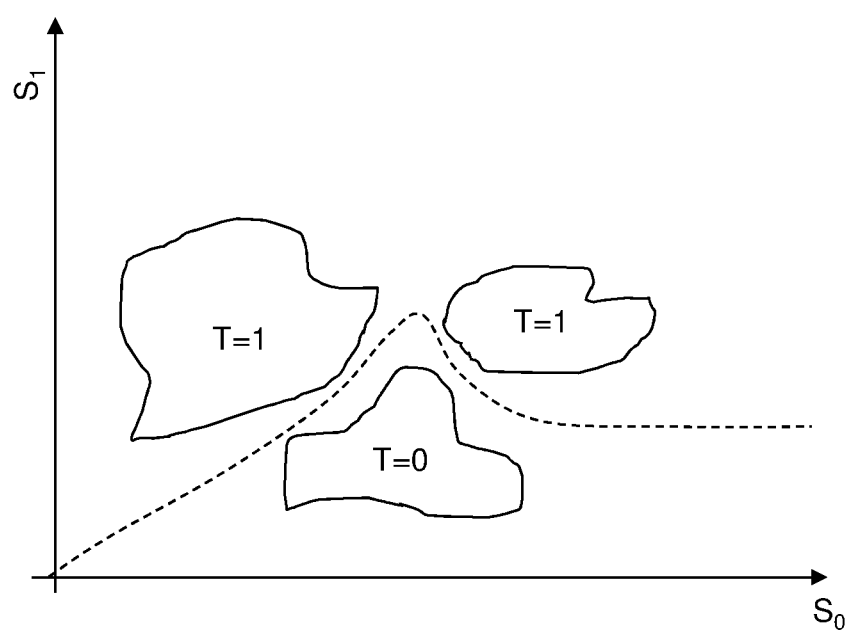
FIG. 5 a schematic representation similar to FIG. 4 for a two-dimensional example.

FIG. 5 illustrates a further example for a two-dimensional sensor signal $(S_0, S_1)$. This sensor signal can comprise two components of the same physical signal, for instance the level and the phase, or it originates from two sources such as the near and far zone elements 26a-b or also two completely different sensor elements such as an inductive sensor and a light sensor. The occurrence in the individual bins is now applied on the Z axis, with the example shown only showing the outlines of bins that have been occupied at all without their heights. In some cases, the simple threshold Th of the one-dimensional case can be replaced with one or more straight lines. A curve is generally required as also in the example case. The optimization problem with which this curve is determined is a little less complex than in the one-dimensional case; the basic principle and the goal of a robust separation with as large a distance as possible from the occurring sensor signals of the respective state T is the same.

A corresponding n-dimensional histogram can also be generated with higher dimensional sensor signals such as from a multisensor having a plurality of detection values or a light receiver divided multiple times. The curve then becomes a generalized boundary curve, namely an n−1 dimensional submanifold or a flat or curved hyperplane.

The histogram approach becomes increasingly impractical for high dimensional sensor signals, for example of a multisensor having a large number of measurement methods or an image sensor having a number of pixels, because it becomes more and more complex to find a distinct generalized boundary curve. Known methods of, for example, image processing or general classifiers can then be used.

A classifier is in particular used that is based on machine learning, preferably an artificial neuronal network. A training data set that can be scaled by the length of the teaching phase and is already labeled is provided in an automated manner with the sensor signals and the associated desired object determination signals. In this approach, the procedure explained with respect to FIG. 3 is particularly suitable in which the teaching procedure has been outsourced to a cloud 50 or at least to external to where the sensor 10 transfers the sensor signals and optionally the associated predefined object determination signals over the communication interface 48 designed as sufficiently broadband. The processing power available in the teaching phase is then of any desired amount for all practical needs despite a furthermore simple internal evaluation unit 28 of the sensor 10.

The teaching process in accordance with the invention is by no means only suitable to set a classical switching threshold. A flexibility and adaptability is rather thereby provided that very substantially expands the application spectrum of a sensor. Conventionally, separately adapted sensors are manufactured for a large number of applications because no available mass produced product satisfies the special demands. Real hardware interventions, hardware expansions and hardware conversions are required for this purpose such as a replacement of transmission elements for a suitable wavelength, a modification of the optics, and the evaluation or firmware.

It is now possible in accordance with the invention to equip a sensor 10 in advance with more or more powerful sensor elements than current conventional sensors. A light barrier therefore no longer only comprises its light transmitter and its light receiver, but rather, for example, a light source whose wavelength is switchable, a second receiver optics, a light receiver segmented into additional light reception elements, or also pick-ups for pressure, temperature, and sound. Such flexible sensors 10 are then installed for specific applications that a standard sensor cannot solve to improve the definition or distinguishability of objects to be detected by additional signals.

The sensor 10 then also does not know in advance how the sensor signals are to be processed to a matching object determination signal, but accordingly does not have a separately adapted evaluation. In the teaching phase, sensor signals of the detection situations to be solved are recorded, preferably also already labeled in one of the described manners by the desired associated object determination signal. The sensor 10 therefore serves for the generation of training data. The actual training takes place in the cloud 50 to keep the sensor 10 simple. On site, the user 10 therefore only has to start the teaching phase and to take care that then the desired detection situations are presented to the sensor 10. This typically simply corresponds to the customary operation, that is, for example, by a start of the system, with, however, as explained, aids 42, 44, 46 and/or additional sensors 38 preferably being used. The training data are subsequently sent to the manufacturer of the sensor 10 or to a corresponding service provider who operates the cloud 50. The evaluation unit 28 receives the switching point after this preferably fully automatic process, in particular as a fully trained classifier, and is thus put into a position to solve the required application. Alternatively to a training over the cloud 50, however, it is still not precluded to use a correspondingly powerful internal evaluation unit 28.

Which part of the available sensor information correlates with the specific problem is automatically taken into account by the teaching process and in particular by the training of a classier based on machine learning. It is naturally helpful if the sensor is configured for the detection of information of which it can reasonably be assumed that it is helpful and, conversely, obviously irrelevant information is not detected or observed at all in order not to make the training unnecessarily more difficult.

Finally, the teaching in accordance with the invention should be summarized again: In this respect, the features mentioned here do not mean that the invention is restricted thereto and the already explained variation possibilities should in particular in no way be relativized thereby.

The sensor 10 is equipped with an additional training input 32 for the desired object determination signal T. The teaching phase is activated by operating elements at the sensor 10 or by an interface such as IO-Link, whereupon the sensor 10 detects its sensor signal for a plurality of detection situations while it is simultaneously communicated to it via the training input 32 how the respective detection situation is to be evaluated (T=0 or T=1). An optimization then follows to find a switching point in the generalized sense used here by which an object determination signal is associated with a sensor signal in operation. This switching point should be as robust as possible and should be in as good an agreement as possible with the specifications of the teaching phase.

To achieve this, the sensor 10 can be delivered or used in combination with assistance means for the teaching phase. They can be additional sensors 38 such as a through beam light barrier, a contrast sensor, or a tactile sensor together with conceivable provisional fastening means also in unusual installation positions and/or aids 42, 44, 46 such as a reflector tape or a color or a high contrast pattern.

In preferred embodiments, the sensor 10 has a communication interface 48 to transmit sensor signals or already labeled training data to a cloud 50. A server architecture is therefore then provided to automatically derive the switching point from the training data, in particular in the form of a suitable transfer function for $Q=f(S)$, parameters for an already fixed transfer function such as a threshold Th, or a classifier, specifically a fully trained neuronal network that is reflected back to the sensor 10 as a whole or in the form of its links and weightings. It can be a service provider for an automated or semiautomatic customized adaptation ("customizing") of sensors 10 to critical or especially demanding applications.

It is conceivable in an expansion to teach a sensor 10 for a plurality of situations, that is to determine a plurality of switching points from a plurality of sequences of a plurality of detection situations. Examples are a use at day and night or for changing loads of objects 20. It is then possible to switch over the function of the sensor 10 without a teaching process very quickly, optionally also in a sliding manner, for instance, between the day and night setting at dusk or with an overcast sky.

A quality criterion can furthermore also be determined during the derivation. Most optimizations also deliver this. In the example of FIG. 4, the distance between the two clusters T=0 and T=1 would be suitable for this. On a classification on the basis of machine teaching, some of the training data can be separated and used as test data. The quality criterion is per se already a valuable piece of information on the quality of the taught switching point. It also makes it possible to repeat the teaching under different conditions, for instance with different parameters for the sensor element 36 or in different detection positions of the sensor 10, naturally only within the framework of what the application permits. The best conditions of use for the sensor 10 can then be found on the basis of the quality criterion.

The sensor 10 can contribute its own evaluation during teaching. There are thus non-monitored training possibilities (unsupervised learning) and deterministic algorithms to set a suitable threshold, for example. The teaching also does not have to remain a single process, but a post-teaching can rather take place for tracking to different conditions or for taking account of additional detection situations. In this case, the sensor 10 does not start "at zero", but rather at the previously taught switching point, and the evaluation by this switching point, in particularly the previously trained classifier, also flows into the labeling of the training data or into the determination of the new switching point.

The invention claimed is:

1. A sensor for detecting an object in a monitored zone, the sensor comprising:
   at least one sensor element configured to detect a sensor signal;
   a switch output configured to output a binary object determination signal; and
   an evaluation unit that is configured to generate the object determination signal from the sensor signal in dependence on the detected object and to determine, in a teaching phase, a switching point that determines the association between the sensor signal and the object determination signal, wherein the switching point is a selected threshold point for correlating sensed data with a determination of detection of an object, wherein the evaluation unit is further configured to detect a respective sensor signal for a plurality of detection situations in the teaching phase, the teaching phase being configured as a training phase for supervised training of the switching point such that the switching point is determined by a set of training data including correlations between training sample sensor signals and training sample object detections, with the associated object determination signal being predefined for the respective detection situation by at least one additional sensor providing the training sample sensor signals for evaluating the detection situations during the teaching phase, the switching point being derived therefrom.

2. The sensor in accordance with claim 1, that has a training input for the predefined object determination signal.

3. The sensor in accordance with claim 1, wherein the at least one additional sensor generates the predefined object determination signal.

4. The sensor in accordance with claim 3, wherein the at least one additional sensor is only provided temporarily during the teaching phase.

5. The sensor in accordance with claim 3, that has a training input for the predefined object determination signal, wherein a switch output of the at least one additional sensor is connected to the training input.

6. The sensor in accordance with claim 3, wherein the at least one additional sensor detects a different sensor signal than the sensor and/or evaluates the sensor signal in a different manner.

7. The sensor in accordance with claim 3, wherein the at least one additional sensor is based on a more complex and/or more error prone sensor principle than the sensor.

8. The sensor in accordance with claim 3, wherein the at least one additional sensor is arranged in a position and/or in a manner that does not correspond to any of the positions and/or manners possible for the sensor during operation.

9. The sensor in accordance with claim 1, wherein at least one object changing the detection of a sensor signal is at least temporarily arranged in the monitored zone during the teaching phase.

10. The sensor in accordance with claim 1, wherein at least one one-dimensional or multi-dimensional histogram is formed from the sensor signals detected in the teaching phase and the switching point is derived from the histogram.

11. The sensor in accordance with claim 1, wherein the switching point has at least one threshold or a boundary curve.

12. The sensor in accordance with claim 1, wherein the switching point has a classifier.

13. The sensor in accordance with claim 12, wherein the switching point has a classifier in accordance with a method of machine teaching.

14. The sensor in accordance with claim 1, wherein the sensor is connected to a higher ranking processing unit during and/or after the teaching phase and the switching point is determined in the processing unit and is returned to the evaluation unit.

15. The sensor in accordance with claim 14, wherein the higher ranking processing unit is one of a server and a cloud.

16. The sensor in accordance with claim 1, wherein the sensor is a light barrier or a light sensor.

17. The sensor in accordance with claim 1, wherein the sensor has a plurality of sensor elements having different properties.

18. A method of setting a switching point of a sensor that detects objects in a monitored zone in that a sensor signal is detected, a binary object determination signal is generated therefrom, and is output at a switching output, wherein the switching point determines the association between the sensor signal and the object determination signal and is determined in a teaching phase, wherein the switching point is a selected threshold point for correlating sensed data with a determination of detection of an object, wherein a respective sensor signal for a plurality of detection situations is detected in the teaching phase, the teaching phase being configured as a training phase for supervised training of the switching point such that the switching point is determined by a set of training data including correlations between training sample sensor signals and training sample object detections, with the associated object determination signal being predefined for the detection situation by at least one additional sensor providing the training sample sensor signals for evaluating the detection situations during the teaching phase, the switching point being derived therefrom.

* * * * *